(12) United States Patent
Ikawa et al.

(10) Patent No.: US 9,970,994 B2
(45) Date of Patent: May 15, 2018

(54) ELECTRONIC DEVICE

(71) Applicant: SHARP KABUSHIKI KAISHA, Osaka-shi, Osaka (JP)

(72) Inventors: Yuta Ikawa, Osaka (JP); Ken Sumitani, Osaka (JP); Tsuyoshi Ono, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 9 days.

(21) Appl. No.: 14/758,086

(22) PCT Filed: Nov. 27, 2013

(86) PCT No.: PCT/JP2013/081893
§ 371 (c)(1),
(2) Date: Jun. 26, 2015

(87) PCT Pub. No.: WO2014/103598
PCT Pub. Date: Jul. 3, 2014

(65) Prior Publication Data
US 2015/0355289 A1    Dec. 10, 2015

(30) Foreign Application Priority Data

Dec. 27, 2012 (JP) ................ 2012-283899

(51) Int. Cl.
*G01R 31/44* (2006.01)
*H05B 33/08* (2006.01)
*G01R 31/26* (2014.01)

(52) U.S. Cl.
CPC ......... *G01R 31/44* (2013.01); *H05B 33/0815* (2013.01); *H05B 33/0827* (2013.01); *H05B 33/0893* (2013.01); *G01R 31/2635* (2013.01)

(58) Field of Classification Search
CPC .... G01R 31/44; G01R 31/2635; G09G 3/006; H05B 33/0815
(Continued)

(56) References Cited

U.S. PATENT DOCUMENTS

| 374,850 A | * | 12/1887 | Reinmann | ............... G01M 3/04 324/414 |
| 2,746,011 A | * | 5/1956 | Carson | ................... H01K 3/305 324/414 |

(Continued)

FOREIGN PATENT DOCUMENTS

| JP | 7-321624 A | 12/1995 |
| JP | 2003-317978 A | 11/2003 |
| JP | 2010-123273 A | 6/2010 |

*Primary Examiner* — Jermele M Hollington
*Assistant Examiner* — Christopher McAndrew
(74) *Attorney, Agent, or Firm* — Birch, Stewart, Kolasch & Birch, LLP

(57) ABSTRACT

To provide an electronic device that can detect an abnormality in an element with a simple configuration. An electronic device 1 includes: a first element string group 21 formed by at least one element string 211 to 21m connected in parallel, the element string 211 to 21m being formed by at least one element connected in series; a second element string group 22 formed by the element string 221 to 22n being at least one in number and connected in parallel; and an abnormality detecting unit 4 that detects an abnormality in the element string 211 to 21m and 221 to 22n forming at least one of the first element string group 21 and the second element string group 22, based on whether or not a first current $I_{21}$ being the sum of current flowing through the element string 211 to 21m forming the first element string group 21 and a second current $I_{22}$ being the sum of current flowing through the element string 221 to 22n forming the second element string group 22 satisfy a prescribed relationship.

7 Claims, 10 Drawing Sheets

(58) Field of Classification Search
USPC .......................................................... 324/414
See application file for complete search history.

(56) References Cited

U.S. PATENT DOCUMENTS

| | | | | |
|---|---|---|---|---|
| 6,972,570 | B2* | 12/2005 | Schriefer | G01R 31/245 |
| | | | | 315/86 |
| 8,087,798 | B2* | 1/2012 | Mazzochette | H05B 33/0845 |
| | | | | 324/414 |
| 2005/0062481 | A1* | 3/2005 | Vaughn | B61L 5/1881 |
| | | | | 324/500 |
| 2008/0204029 | A1* | 8/2008 | Mihai | H05B 33/089 |
| | | | | 324/414 |
| 2010/0033097 | A1* | 2/2010 | Koh | H05B 41/2855 |
| | | | | 315/119 |
| 2010/0049454 | A1* | 2/2010 | Irissou | H05B 33/0893 |
| | | | | 702/58 |
| 2012/0074947 | A1* | 3/2012 | Cortigiani | H05B 33/0845 |
| | | | | 324/414 |
| 2012/0200296 | A1* | 8/2012 | Avenel | H05B 33/089 |
| | | | | 324/414 |
| 2012/0206146 | A1* | 8/2012 | Avenel | H05B 33/089 |
| | | | | 324/414 |

* cited by examiner

43a

CONVENTIONAL ART

ELECTRONIC DEVICE

CROSS-REFERENCE TO RELATED APPLICATIONS

This application is a National Phase filing under 35 U.S.C. § 371 of International Application No. PCT/JP2013/081893 filed on Nov. 27, 2013, which claims priority to Japanese Patent Application No. 2012-283899 filed on Dec. 27, 2012.

TECHNICAL FIELD

The present invention relates to an electronic device that includes a plurality of elements such as light emitting diodes (hereinafter referred to as LEDs).

BACKGROUND ART

Conventionally, in connection with electronic devices each including a plurality of elements, there have been proposed electronic devices of various types that can detect an abnormality in the elements. Specifically, for example, Patent Document 1 discloses an illumination apparatus that includes a circuit for detecting an abnormality in LEDs.

A description will be given of the illumination apparatus of Patent Document 1 with reference to the drawings. FIG. 10 is a block diagram showing a conventional illumination apparatus.

As shown in FIG. 10, an illumination apparatus 100 includes: X pieces of LED strings 1011 to 101X (where X is a natural number equal to or greater than 2), each string being formed by series-connected LEDs 200; a power supply unit 102 supplying power to the LEDs 200; a reference voltage generating unit 103 that divides supply voltage from the power supply unit 102 to generate reference voltage; X pieces of resistors 1041 to 104X that are connected in series to the LED strings 1011 to 101X to generate detection voltage that corresponds to current flowing through the LED strings 1011 to 101X; and X pieces of comparators 1051 to 105X that compare the detection voltage against the reference voltage for the respective LED strings 1011 to 101X to output an output signal COUT.

In the illumination apparatus 100, upon an occurrence of an abnormality in the LEDs or lines of any of the LED strings 1011 to 101X, one of the comparators 1051 to 105X that corresponds to the abnormal one of the LED strings 1011 to 101X outputs an output signal COUT indicative of the abnormality in the abnormal one of the LED strings 1011 to 101X.

PRIOR ART DOCUMENTS

Patent Documents

Patent Document 1; Japanese Patent Application Publication NO. 2010-123273

SUMMARY OF THE INVENTION

Problems to be Solved by the Invention

However, the illumination apparatus 100 requires the comparators 1051 to 105X as many as the LED strings 1011 to 101X. Therefore, the circuit scale and costs significantly increase.

Accordingly, an object of the present invention is to provide an electronic device being capable of detecting an abnormality in elements with a simple configuration.

Means for Solving the Problem

In order to solve the problem, the present invention provides an electronic device comprising: a first element string group formed by at least one element string connected in parallel, the element string being formed by at least one element connected in series; a second element string group formed by the element string being at least one in number and connected in parallel; and an abnormality detecting unit that detects an abnormality in the element string forming at least one of the first element string group and the second element string group, based on whether or not a first current being a sum of current flowing through the element string forming the first element string group and a second current being a sum of current flowing through the element string forming the second element string group satisfy a prescribed relationship.

Further, in the electronic device, preferably the abnormality detecting unit includes: a first load unit having one end connected to the first element string group to output a first voltage corresponding to the first current from the one end; a second load unit having one end connected to the second element string group to output a second voltage corresponding to the second current from the one end; and a comparator unit comparing magnitude between the first voltage and the second voltage to detect an abnormality in the element string belonging to at least one of the first element string group and the second element string group, wherein the first load unit has other end connected to other end of the second load unit, and a ratio between a resistance value of the first load unit and a resistance value of the second load unit is set to a ratio between a paralleled number of the element string forming the second element string group and a paralleled number of the element string forming the first element string group.

Further, in the electronic device, it is also possible that the first load unit and the second load unit are each formed by at least one resistor connected in parallel, and a ratio between a paralleled number of the resistor forming the first load unit and a paralleled number of the resistor forming the second load unit is set to a ratio between a paralleled number of the element string forming the first element string group and a paralleled number of the element string forming the second element string group.

Further, in the electronic device, the first load unit and the second load unit are each formed by at least one transistor connected in parallel, a first electrode of the transistor being the one end and a second electrode of the transistor being the other end, the transistor forming the first load unit and the transistor forming the second load unit have their respective control electrodes connected to each other, the at least one transistor forming the first load unit having the control electrode and the first electrode connected to each other, and a ratio between a paralleled number of the transistor forming the first load unit and a paralleled number of the transistor forming the second load unit is set to a ratio between a paralleled number of the element string forming the first element string group and a paralleled number of the element string forming the second element string group.

Further, in the electronic device, the transistor is an NPN bipolar transistor whose collector is the first electrode, whose emitter is the second electrode, and whose base is the control electrode.

Further, the electronic device may further comprise an offset load unit connected in parallel with at least one of the first load unit and the second load unit.

Further, in the electronic device, preferably, the element string forming the first element string group and the element string forming the second element string group are equal to each other in characteristics as to current and voltage, and the abnormality detecting unit detects the abnormality in the element string forming at least one of the first element string group and the second element string group, when a ratio between the first current and the second current deviates from the ratio between the paralleled number of the element string forming the first element string group and the paralleled number of the element string forming the second element string group by more than a prescribed degree.

Effect of the Invention

The illumination apparatus described above can detect an abnormality in element strings, just by including the abnormality detecting unit that detects an abnormality in the relationship between the first current and the second current. Accordingly, it becomes possible to detect an abnormality in element strings with a simple configuration, without the necessity of including apparatuses for individually detecting an abnormality in the element strings.

DESCRIPTION OF EMBODIMENT

In the following, a description will be given of an illumination apparatus that can detect an abnormality in LEDs, as an example of an electronic device according to an embodiment of the present invention. Note that, the illumination apparatus described in the following is merely an embodiment of the electronic device of the present invention.

<Overall Exemplary Configuration of Illumination Apparatus>

Figure 1:
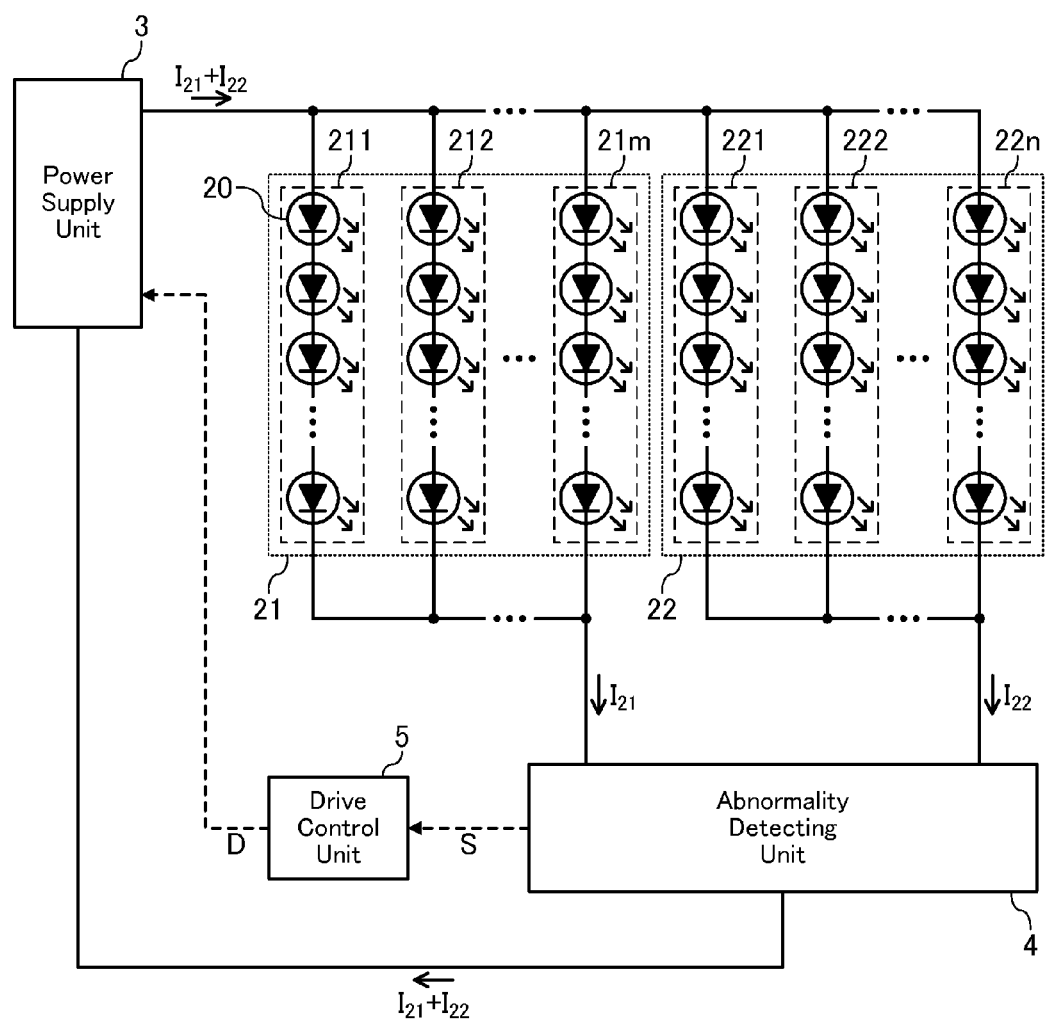
FIG. 1 is a block diagram showing an overall exemplary configuration of an illumination apparatus according to an embodiment of the present invention.

Firstly, with reference to the drawings, a description will be given of an overall exemplary configuration of the illumination apparatus according to an embodiment of the present invention. FIG. 1 is a block diagram showing an overall exemplary configuration of the illumination apparatus according to an embodiment of the present invention.

As shown in FIG. 1, an illumination apparatus 1 includes a first LED element string group 21 (a first element string group), a second LED element string group 22 (a second element string group), a power supply unit 3, an abnormality detecting unit 4, and a drive control unit 5.

The first LED element string group 21 is formed by LED element strings 211 to 21$m$ (element strings) in m strings (where m is a natural number). The second LED element string group 22 is formed by LED element strings 221 to 22$n$ in n strings (where n is a natural number). The LED element strings 211 to 21$m$ and 221 to 22$n$ are each formed by at least one LED 20 (element) connected in series.

The power supply unit 3 supplies power (e.g., DC power or pulsed power under PWM control) to the LED element strings 211 to 21$m$ and 221 to 22$n$.

The abnormality detecting unit 4 detects an abnormality in the LED element strings 211 to 21$m$ and 221 to 22$n$ forming at least one of the first LED element string group 21 and the second LED element string group 22, based on whether or not a first current $I_{21}$ being the sum of current flowing through the LED element strings 211 to 21$m$ forming the first LED element string group 21 and a second current $I_{22}$ being the sum of current flowing through the LED element strings 221 to 22$n$ forming the second LED element string group 22 satisfy a prescribed relationship. Then, the abnormality detecting unit 4 outputs an output signal S indicative of presence/absence of an abnormality in the LED element strings 211 to 21$m$ and 221 to 22$n$ to the drive control unit 5. Note that, the abnormality detecting unit 4 will be detailed later.

When the drive control unit 5 acquires the output signal S output from the abnormality detecting unit 4 and learns that there is no abnormality in the LED element strings 211 to 21$m$ and 221 to 22$n$, the drive control unit 5 outputs a control signal D that instructs the power supply unit 3 to continue a normal mode operation (e.g., to continue power supply to the LED element strings 211 to 21$m$ and 221 to 22$n$). On the other hand, when the drive control unit 5 acquires the output signal S output from the abnormality detecting unit 4 and learns that there is an abnormality in the LED element strings 211 to 21$m$ and 221 to 22$n$, the drive control unit 5 outputs a control signal D that instructs the power supply unit 3 to perform an abnormal mode operation (e.g., to stop power supply to the LED element strings 211 to 21$m$ and 221 to 22$n$).

Preferably, the LED element strings 211 to 21$m$ and 221 to 22$n$ are equal to one another in the electrical characteristics. Specifically, for example, preferably the rank of the LEDs 20 (particularly, the rank as to forward voltage) forming the LED element strings 211 to 21$m$ and 221 to 22$n$ is selected such that the LED element strings 211 to 21$m$ and 221 to 22$n$ are equal to one another in the characteristics as to current and voltage. Note that, the electrical characteristics are just required to be equal on an LED element string-by-LED element string basis. Therefore, it is not necessary for all the LEDs 20 forming the LED element strings 211 to 21$m$ and 221 to 22$n$ to be equal to one another in rank, and one LED element string may contain the LEDs 20 differing in rank.

As described above, the illumination apparatus 1 according to the embodiment of the present invention can detect an abnormality in the LED element strings 211 to 21$m$ and 221 to 22$n$, just by including the abnormality detecting unit 4 that detects an abnormality in the relationship between the first current $I_{21}$ and the second current $I_{22}$. Accordingly, it becomes possible to detect an abnormality in the LED element strings 211 to 21$m$ and 221 to 22$n$ with a simple configuration, without the necessity of including apparatuses for individually detecting an abnormality in the LED element strings 211 to 21$m$ and 221 to 22$n$.

Note that, while FIG. 1 exemplarily shows that the drive control unit 5 controls the operation of the power supply unit 3 by outputting the control signal D to the power supply unit 3, in some cases, the drive control unit 5 is a simple apparatus such as a switch that controls whether or not to permit operation of the power supply unit 3. In this case, it is also possible to recognize the drive control unit 5 as part of the power supply unit 3, and the output signal S output from the abnormality detecting unit 4 is directly input to the power supply unit 3.

<Exemplary Configuration of Abnormality Detecting Unit>

Figure 2:
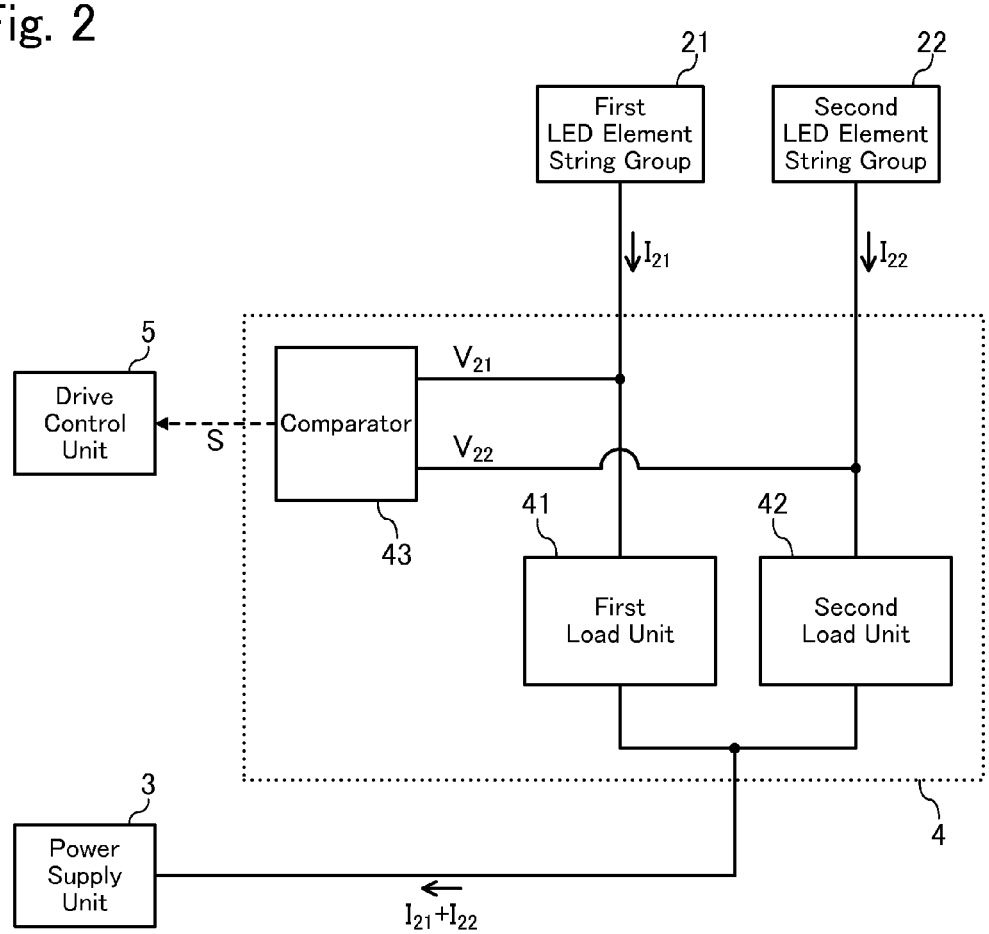
FIG. 2 is a block diagram showing an exemplary configuration of an abnormality detecting unit shown in FIG. 1.

Next, a description will be given of an exemplary configuration of the abnormality detecting unit shown in FIG. 1. FIG. 2 is a block diagram showing the exemplary configuration of the abnormality detecting unit shown in FIG. 1.

As shown in FIG. 2, the abnormality detecting unit 4 includes a first load unit 41, a second load unit 42, and a comparator unit 43.

The first load unit 41 has one end connected to the first element string group 21, and acquires a first voltage $V_{21}$ corresponding to the first current $I_{21}$ from the one end. Further, the second load unit 42 has one end connected to the second element string group 22, and acquires a second voltage $V_{22}$ corresponding to the second current $I_{22}$ from the one end. Further, other ends of the first load unit 41 and the second load unit 42 are connected to each other, and further connected to the power supply unit 3.

The ratio between the resistance value of the first load unit 41 and the resistance value of the second load unit 42 is set to n:m (i.e., the ratio between the paralleled number of the LED element strings 221 to 22$n$ of the second element string group 22 and the paralleled number of the LED element strings 211 to 21$m$ of the first element string group 21).

As described above, since the LED element strings 211 to 21$m$ and 221 to 22$n$ are equal to one another in the characteristics as to current and voltage, they are equal to one another in the resistance value. Accordingly, in the state where there is no abnormality in any of the LED element strings 211 to 21$m$ and 221 to 22$n$ (hereinafter, this state is referred to as "the normal state"), current of an identical value flows through in each of the LED element strings 211 to 21$m$ and 221 to 22$n$, and the ratio between the first current $I_{21}$ and the second current $I_{22}$ becomes m:n.

Accordingly, in the normal state, the ratio between the first current $I_{21}$ and the second current $I_{22}$ becomes m:n and the ratio between the resistance value of the first load unit 41 and the resistance value of the second load unit 42 becomes n:m. Therefore, the first voltage $V_{21}$ and the second voltage $V_{22}$ become equal to each other.

In contrast, in the state where there is an abnormality such as a break or a short circuit in at least one of the LED element strings 211 to 21$m$ and 221 to 22$n$ (hereinafter this state is referred to as the "abnormal state"), the ratio between the first current $I_{21}$ and the second current $I_{22}$ deviates from m:n.

Specifically, for example, when any one of the LED element strings 221 to 22$n$ of the second element string group 22 becomes open by an occurrence of a break or the like, current does not flow through that LED element string, and the amount of current flowing through other LED element strings increases. As a result, the first current $I_{21}$ becomes larger than that in the normal state, and the second current $I_{22}$ becomes smaller than that in the normal state. Further, conversely to this example, in the case where any one of the LED element strings 211 to 21$m$ of the first element string group 21 becomes open by an occurrence of a break or the like, the first current $I_{21}$ becomes smaller than that in the normal state, and the second current $I_{22}$ becomes larger than that in the normal state.

Accordingly, in the abnormal state, in the case where the first current $I_{21}$ becomes larger than that in the normal state and the second current $I_{22}$ becomes smaller than that in the normal state, the first voltage $V_{21}$ becomes higher than the second voltage $V_{22}$. Similarly, in the case where the first current $I_{21}$ becomes smaller than that in the normal state and the second current $I_{22}$ becomes larger than that in the normal state, the first voltage $V_{21}$ becomes lower than the second voltage $V_{22}$. That is, in the abnormal state, the first voltage $V_{21}$ and the second voltage $V_{22}$ are different from each other.

Then, the comparator unit 43 compares magnitude between the first voltage $V_{21}$ and the second voltage $V_{22}$, to detect that the first voltage $V_{21}$ and the second voltage $V_{22}$ are different from each other. Thus, the comparator unit 43 detects the abnormal state.

In this manner, the abnormality detecting unit 4 can detect the abnormal state just by comparing magnitude between the first voltage $V_{21}$ and the second voltage $V_{22}$ (particularly, by detecting that the first voltage $V_{21}$ and the second voltage $V_{22}$ are different from each other). Therefore, the configuration of the abnormality detecting unit 4 can be simplified.

<Exemplary Specific Circuit Configuration of Abnormality Detecting Unit>

Next, a description will be given of an exemplary specific circuit configuration of the abnormality detecting unit 4 shown in FIG. 2 with reference to the drawings.

First Load Unit and Second Load Unit: Example 1

Figure 3:
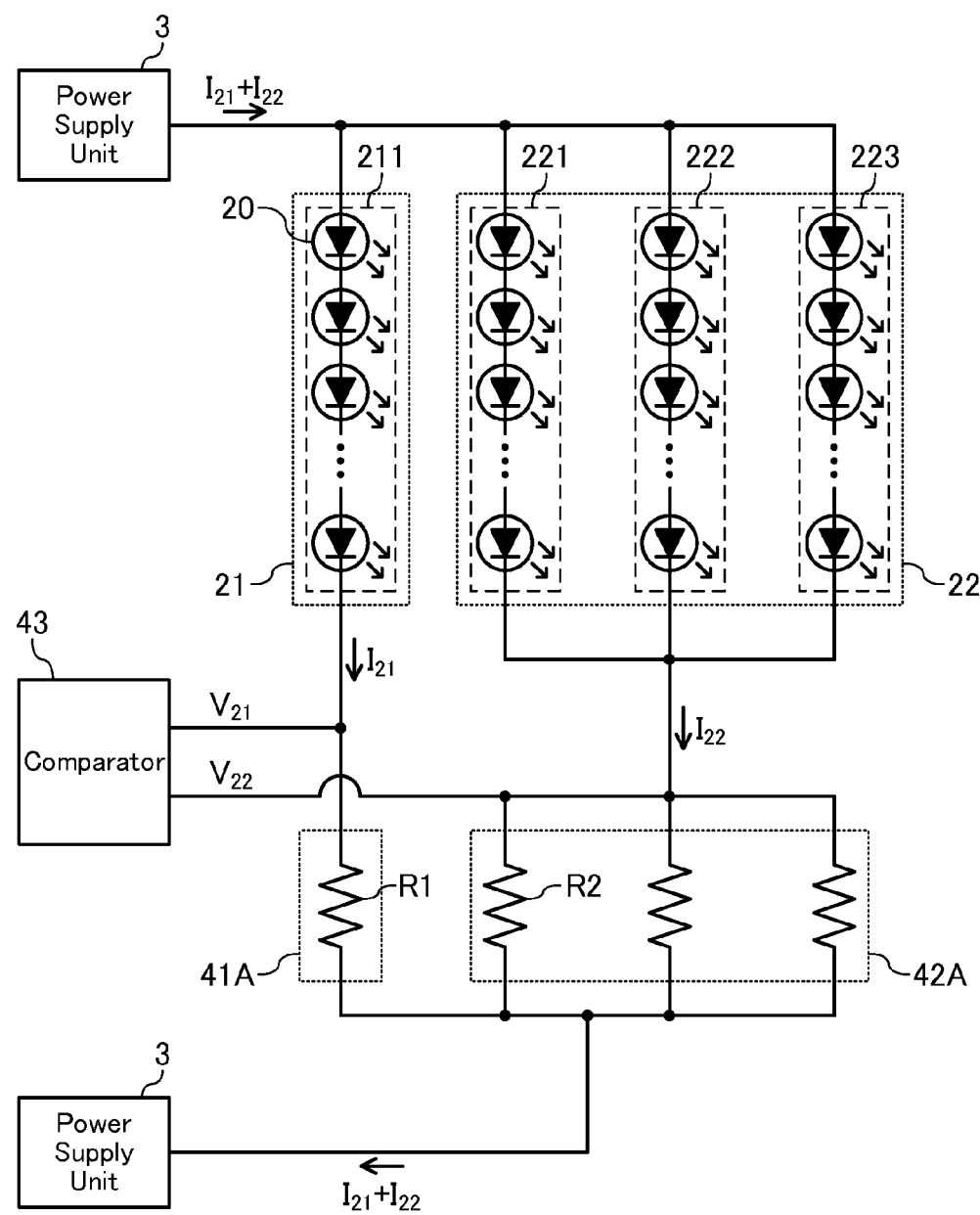
FIG. 3 is a circuit diagram showing Example 1 of a specific circuit configuration of a first load unit and a second load unit shown in FIG. 2.

Firstly, a description will be given of Example 1 of a specific circuit configuration of the first load unit 41 and the second load unit 42 shown in FIG. 2 with reference to the drawings. FIG. 3 is a circuit diagram showing Example 1 of the specific circuit configuration of the first load unit and the second load unit shown in FIG. 2. Note that, in order to simplify the illustration, FIG. 3 exemplarily shows the case where m=1 and n=3.

As shown in FIG. 3, the first load unit 41A and the second load unit 42A are respectively formed by at least one resistor R1 and at least one resistor R2 connected in parallel. In particular, the ratio between the paralleled number of the resistor R1 forming the first load unit 41A and the paralleled number of the resistor R2 forming the second load unit 42A is represented as m:n. Note that, FIG. 3 exemplarily shows the case where the first load unit 41A is formed by one resistor R1 and the second load unit 42A is formed by three resistors R2. Further, the resistors R1 and R2 are equal to one another in the electrical characteristic (particularly, the resistance value).

One end of the resistor R1 (one end of the first load unit 41A) is connected to the first LED element string group 21. One ends of the resistors R2 (one end of the second load unit 42A) are connected to the second LED element string group 22. Further, other ends of the resistors R1 and R2 (other ends of the first load unit 41A and the second load unit 42A) are connected to one another, and further connected to the power supply unit 3.

By structuring the first load unit 41A and the second load unit 42A as in the present Example, the ratio between the resistance value of the first load unit 41A and the resistance value of the second load unit 42A can be set to n:m as described above. Accordingly, the first load unit 41A and the second load unit 42A can be implemented by an extremely simple circuit, namely, the parallel connection circuit of the resistors R1 and R2.

First Load Unit and Second Load Unit: Example 2

Figure 4:
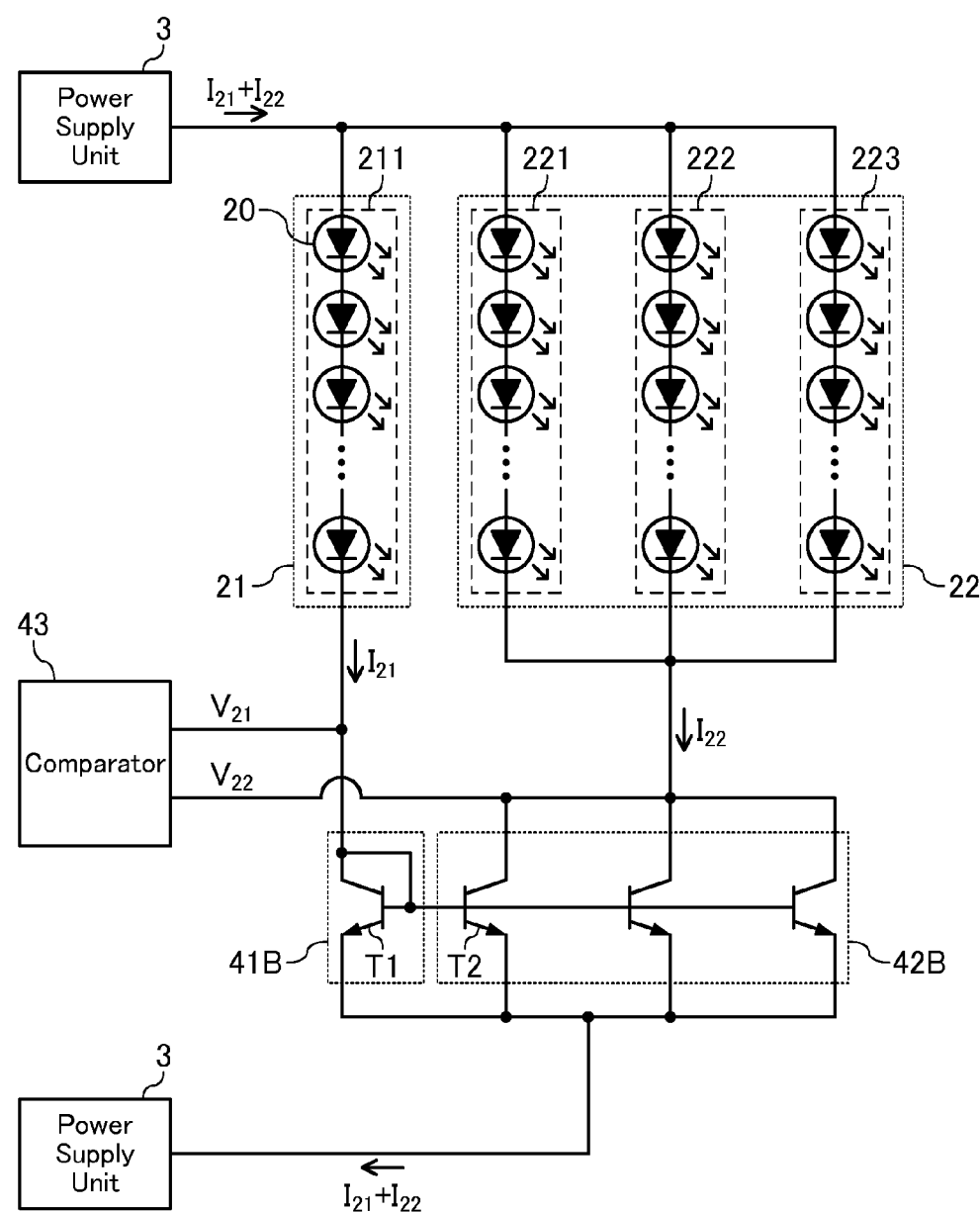
FIG. 4 is a circuit diagram showing Example 2 of a specific circuit configuration of the first load unit and the second load unit shown in FIG. 2.

Further, a description will be given of Example 2 of the specific circuit configuration of the first load unit 41 and the second load unit 42 shown in FIG. 2 with reference to the drawings. FIG. 4 is a circuit diagram showing Example 2 of the specific circuit configuration of the first load unit and the second load unit shown in FIG. 2. Note that, in order to simplify the illustration, FIG. 4 exemplarily shows the case where m=1 and n=3.

As shown in FIG. 4, the first load unit 41B and the second load unit 42B are respectively formed by at least one transistor (e.g., an NPN bipolar transistor) T1 and at least one transistor T2 connected in parallel. In particular, the ratio between the paralleled number of the transistor T1 forming the first load unit 41B and the paralleled number of the transistor T2 forming the second load unit 42B is represented as m:n. Note that, FIG. 4 exemplarily shows the case where the first load unit 41B is formed by one transistor T1 and the second load unit 42B is formed by three transistors T2. Further, the transistors T1 and T2 are equal to one another in the electrical characteristic (particularly, the ON resistance).

Collector of the transistor T1 (one end of the first load unit 41B) is connected to the first LED element string group 21. Collector of the transistor T2 (one end of the second load unit 42B) is connected to the second LED element string group 22. Further, emitters of the transistors T1 and the transistors T2 (other ends of the first load unit 41B and the second load unit 42B) are connected to one another, and further connected to the power supply unit 3. Further, bases of the transistors T1 and T2 are connected to one another, and base and collector of the transistor T1 are connected to each other. Note that, in the case where there is a plurality of transistors T1, though bases of the transistors T1 and T2 must be connected to one another, base and collector of at least one of the transistors T1 should be connected to each other.

By structuring the first load unit 41B and the second load unit 42B as in the present Example, the ratio between the resistance value of the first load unit 41B and the resistance value of the second load unit 42B can be set to n:m as described above.

Here, the first load unit 41B and the second load unit 42B form a current mirror circuit in which current flowing through the transistor T1 having its base and collector connected to each other is the reference. Accordingly, in the normal state, the ratio between the first current $I_{21}$ and the second current $I_{22}$ can be precisely approximated to m:n. Further, it becomes possible to cause current of an identical value to stably flow through the LED element strings 211 to 21m and 221 to 22n that form the first LED element string group 21 and the second LED element string group 22, respectively. Still further, it becomes possible to precisely equalize the first voltage $V_{21}$ and the second voltage $V_{22}$.

On the other hand, in the abnormal state, though the first load unit 41B and the second load unit 42B operate as a current mirror circuit as described above, it is not enough to recover the ratio of m:n between the first current $I_{21}$ and the second current $I_{22}$. Therefore, the ratio between the first current $I_{21}$ and the second current $I_{22}$ deviates from m:n, and the first voltage $V_{21}$ and the second voltage $V_{22}$ are different from each other. Accordingly, also in the case where the first load unit 41B and the second load unit 42B of the present Example are provided, the comparator unit 43 can detect the abnormal state.

Note that, the transistors T1 and T2 are not limited to bipolar transistors as described above, and may be of other type such as MOS (Metal Oxide Semiconductor) transistors.

Comparator Unit: Example 1

Figure 5:
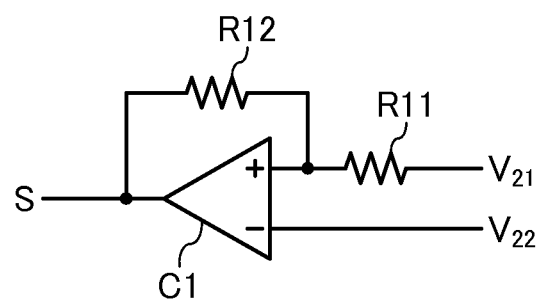
FIG. 5 is a circuit diagram showing Example 1 of a specific circuit configuration of a comparator unit shown in FIG. 2.

Next, a description will be given of Example 1 of a specific circuit configuration of the comparator unit 43 shown in FIG. 2 with reference to the drawings. FIG. 5 is a circuit diagram showing Example 1 of the specific circuit configuration of the comparator unit shown in FIG. 2.

As shown in FIG. 5, a comparator unit 43a includes a comparator C1 and resistors R11 and R12.

One end of the resistor R11 is connected to one end of the first load unit 41, and other end of the resistor R11 is connected to the non-inverting input terminal (+) of the comparator C1. One end of the resistor R12 is connected to other end of the resistor R11, and other end of the resistor R12 is connected to the output terminal of the comparator C1. The inverting input terminal (−) of the comparator C1 is connected to one end of the second load unit 42.

That is, the comparator unit 43a is formed by one hysteresis comparator (C1, R11, R12). Further, an output signal S of the comparator unit 43a is the signal output from the comparator C1. The signal is Low in the normal state, and the signal is High in the abnormal state.

Specifically, for example, in the case where the first voltage $V_{21}$ and the second voltage $V_{22}$ are equal to each other (i.e., the normal state), the comparator C1 outputs a Low signal. On the other hand, in the case where the first voltage $V_{21}$ is higher than a voltage value obtained by adding a prescribed value (hysteresis) to the second voltage $V_{22}$ (i.e., the abnormal state), the comparator C1 outputs a High signal.

In this manner, the comparator unit 43a of the present Example can detect that the first voltage $V_{21}$ and the second voltage $V_{22}$ are different from each other and output an output signal S (High) indicative of the abnormal state.

Note that, though the comparator unit 43a of the present Example can detect the abnormal state in which the first voltage $V_{21}$ becomes higher than the second voltage $V_{22}$, it cannot detect the abnormal state in which the second voltage $V_{22}$ becomes higher than the first voltage $V_{21}$. Specifically, for example, though the comparator unit 43a of the present Example can detect the abnormal state in which at least one of the LED element strings 221 to 22n forming the second LED element string group 22 becomes open because of an occurrence of a break or the like, it cannot detect the abnormal state in which at least one of the LED element strings 211 to 21m forming the first LED element string group 21 becomes open because of an occurrence of a break or the like.

Therefore, when it is intended to detect, by the comparator unit 43a, for example the abnormal state in which an LED element string becomes open, it is preferable to minimize the paralleled number m of the LED element strings 211 to 21m forming the first LED element string group 21 and to maximize the paralleled number n of the LED element strings 221 to 22n forming the second LED element string group 22, because the number of the LED element strings 221 to 22n being the target of abnormality detection can be increased.

Comparator Unit: Example 2

Figure 6:
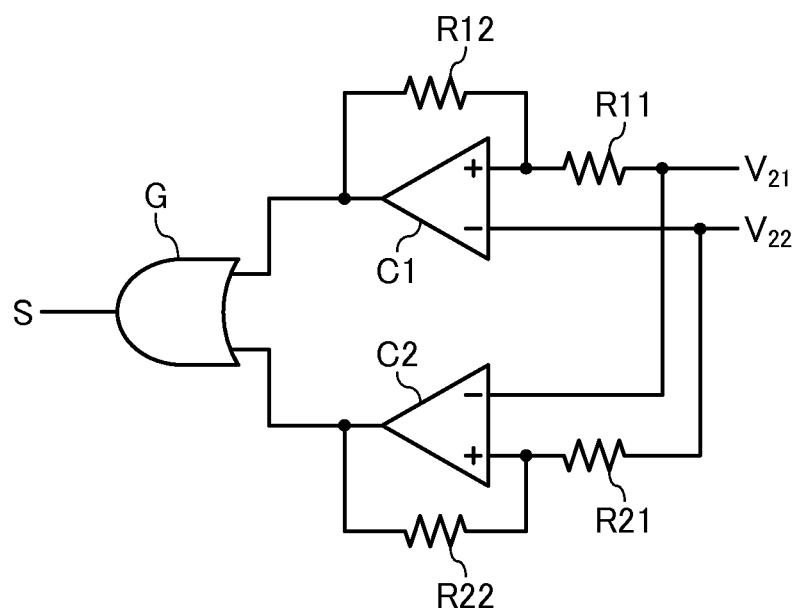
FIG. 6 is a circuit diagram showing Example 2 of a specific circuit configuration of the comparator unit shown in FIG. 2.

Next, a description will be given of Example 2 of a specific circuit configuration of the comparator unit 43 shown in FIG. 2 with reference to the drawings. FIG. 6 is a circuit diagram showing Example 2 of the specific circuit configuration of the comparator unit shown in FIG. 2.

As shown in FIG. 6, a comparator unit 43b includes comparators C1 and C2, resistors R11, R12, R21, and R22, and an OR circuit G.

One end of the resistor R11 is connected to one end of the first load unit 41, and other end of the resistor R11 is connected to the non-inverting input terminal (+) of the comparator C1. One end of the resistor R12 is connected to other end of the resistor R11, and other end of the resistor R12 is connected to the output terminal of the comparator C1. The inverting input terminal (−) of the comparator C1 is connected to one end of the second load unit 42. Further, one end of the resistor R21 is connected to one end of the second load unit 42, and other end of the resistor R21 is connected to the non-inverting input terminal (+) of the comparator C2. One end of the resistor R22 is connected to other end of the resistor R21, and other end of the resistor R22 is connected to the output terminal of the comparator C2. The inverting input terminal (−) of the comparator C2 is connected to one end of the first load unit 41. Further, the OR circuit G outputs a logical OR of signals output from the two comparators C1 and C2.

That is, the comparator unit 43a is formed by a first hysteresis comparator (C1, R11, R12), a second hysteresis comparator (C2, R21, R22) whose input is contrary to that of the first hysteresis comparator (C1, R11, R12), and an OR circuit G that outputs a logical OR of signals output from the first and second hysteresis comparators (C1, R11, R12), (C2, R21, R22), respectively. Further, an output signal S of the comparator unit 43b is the signal output from the OR circuit G. The signal is Low in the normal state and the signal is High in the abnormal state.

Specifically, for example, in the case where the first voltage $V_{21}$ and the second voltage $V_{22}$ are equal to each other (the normal state), both the comparator C1 and the comparator C2 output Low signals. In this case, the OR circuit G outputs a Low signal.

On the other hand, in the case where the first voltage $V_{21}$ is higher than a voltage value obtained by adding a prescribed value (hysteresis) to the second voltage $V_{22}$ (the abnormal state), the comparator C1 outputs a High signal and the comparator C2 outputs a Low signal. In this case, the OR circuit G outputs a High signal. Further, in the case where the second voltage $V_{22}$ is higher than a voltage value obtained by adding a prescribed value (hysteresis) to the first voltage $V_{21}$ (the abnormal state), the comparator C1 outputs a Low signal and the comparator C2 outputs a High signal. In this case, the OR circuit G outputs a High signal.

In this manner, though the structure of the comparator unit 43b of the present Example is more complicated than that of the comparator unit 43a of Example 1 described above (see FIG. 5), the comparator unit 43b of the present Example can detect both the abnormal state in which the first voltage $V_{21}$ is higher than the second voltage $V_{22}$ and the abnormal state in which the second voltage $V_{22}$ is higher than the first voltage $V_{21}$. That is, the comparator unit 43b of the present Example can detect an abnormality as to both of the LED element strings 211 to 21m forming the first LED element string group 21 and the LED element strings 221 to 22n forming the second LED element string group 22.

Note that, the comparator units 43a and 43b are merely examples, and any apparatus can serve as the comparator unit 43 so long as it can compare magnitude between the first voltage $V_{21}$ and the second voltage $V_{22}$ (particularly, an apparatus that can detect that the first voltage $V_{21}$ and the second voltage $V_{22}$ are different from each other).

<Modifications>

[1] As described above, the comparator unit 43 is required to output different output signals S between the case where the first voltage $V_{21}$ and the second voltage $V_{22}$ are equal to each other and the case where they are different from each other. However, by being influenced by variations in manufacture or noises, one of the first voltage $V_{21}$ and the second voltage $V_{22}$ may become slightly higher than the other even in the normal state.

In this regard, the comparator units 43a and 43b using a hysteresis comparator as shown in FIGS. 5 and 6 can output an output signal S (Low) indicative of the normal state by ignoring such a slight difference between the first voltage $V_{21}$ and the second voltage $V_{22}$.

Here, it is also possible to prevent the comparator unit 43 from incorrectly recognizing the abnormal state, by adjusting the first voltage $V_{21}$ and the second voltage $V_{22}$ input to the comparator unit 43. In the following, a description will be given of an exemplary configuration of the illumination apparatus 1 in this case with reference to the drawings.

Figure 7:
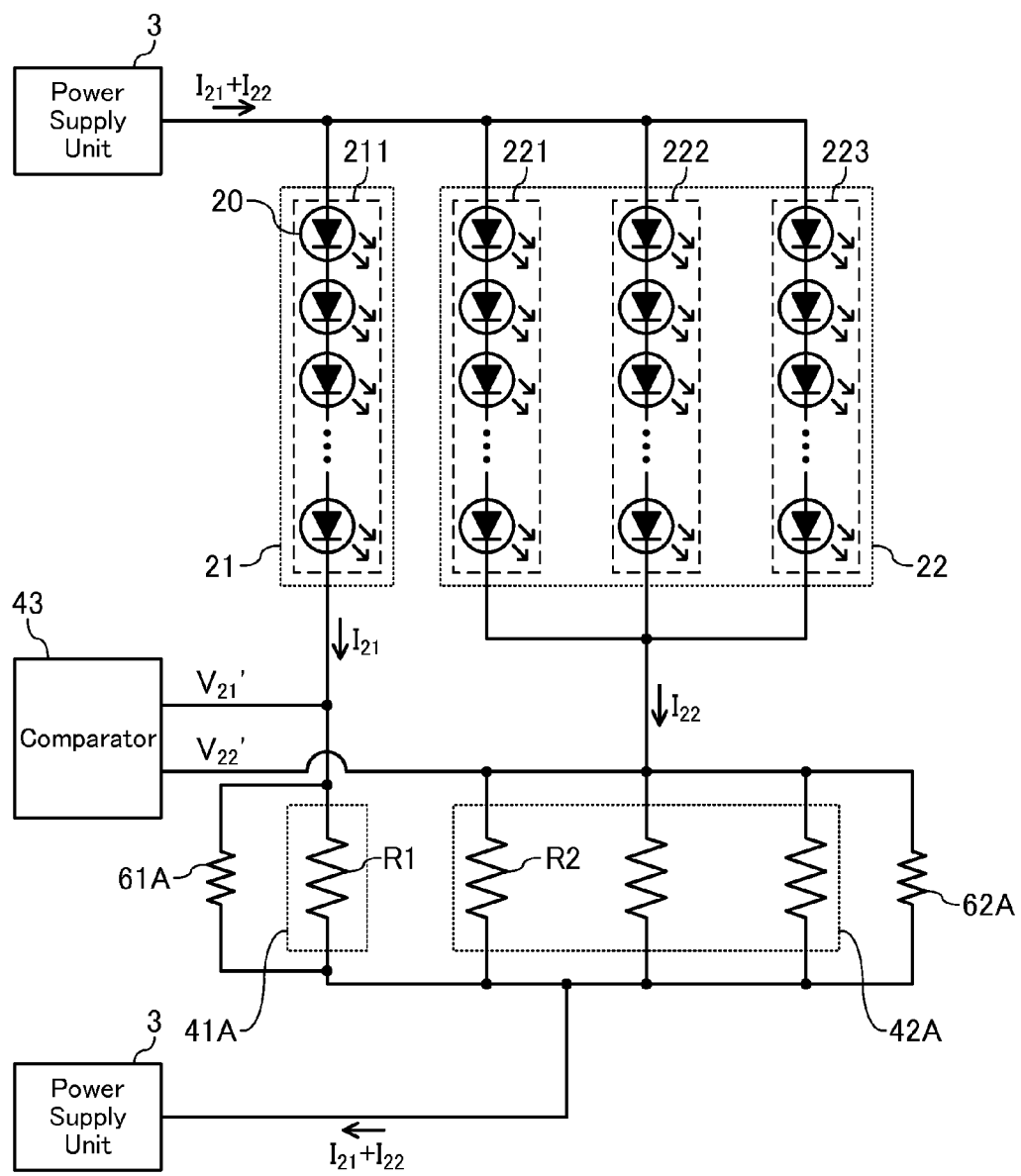
FIG. 7 is a circuit diagram showing Other Example 1 of a specific circuit configuration of an abnormality detecting unit shown in FIG. 2.
Figure 8:
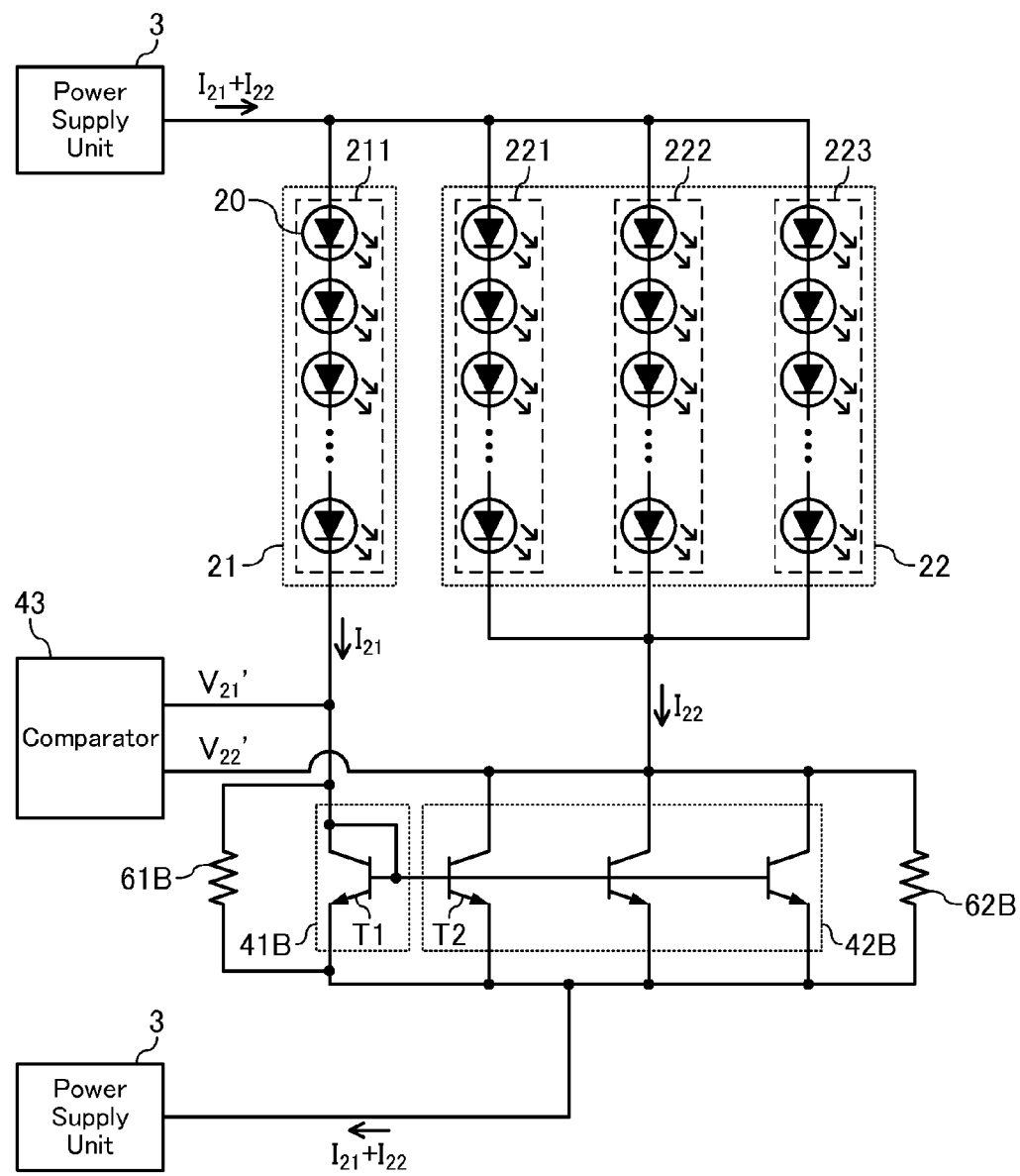
FIG. 8 is a circuit diagram showing Other Example 2 of a specific circuit configuration of the abnormality detecting unit shown in FIG. 2.

FIG. 7 is a circuit diagram showing Other Example 1 of a specific circuit configuration of the abnormality detecting unit. Further, FIG. 8 is a circuit diagram showing Other Example 2 of a specific circuit configuration of the abnormality detecting unit. Note that, Other Example 1 of the abnormality detecting unit shown in FIG. 7 includes the first load unit 41A and the second load unit 42A shown in FIG. 3. Further, Other Example 2 of the abnormality detecting unit shown in FIG. 8 includes the first load unit 41B and the second load unit 42B shown in FIG. 4.

As shown in FIG. 7, an abnormality detecting unit 4 of Other Example 1 includes an offset load unit 61A and an offset load unit 62A. Similarly, an abnormality detecting unit 4 of Other Example 2 shown in FIG. 8 includes an offset load unit 61B and an offset load unit 62B. Note that, various elements having electric resistance can be used as the offset load units 61A, 62A, 61B, and 62B. However, in the following, in order to give a specific description, the case where the offset load units 61A, 62A, 61B, and 62B are each a resistor will be exemplarily described.

As shown in FIG. 7, the offset load unit 61A is connected to the first load unit 41A in a parallel manner. Specifically, one end of the offset load unit 61A is connected to one end of the resistor R1 and other end of the offset load unit 61A is connected to other end of the resistor R1. Similarly, the offset load unit 62A is connected to the second load unit 42A in a parallel manner. Specifically, one end of the offset load unit 62A is connected to one ends of the resistors R2 and other end of the offset load unit 62A is connected to other ends of the resistors R2.

Further, as shown in FIG. 8, the offset load unit 61B is connected to the first load unit 41B in a parallel manner. Specifically, one end of the offset load unit 61B is connected to collector of the transistor T1, and other end of the offset load unit 61B is connected to emitter of the transistor T1. Similarly, the offset load unit 62B is connected to the second load unit 42B in a parallel manner. Specifically, one end of the offset load unit 62B is connected to collectors of the transistors T2, and other end of the offset load unit 62B is connected to emitters of the transistors T2.

The magnitude relationship is fixed such that one of a first voltage $V_{21}'$ and a second voltage $V_{22}'$ in the normal state is higher than the other, by appropriately selecting the resistance values of the offset load units 61A, 62A, 61B, and 62B. In this case, the comparator unit 43 detects the abnormal state when the magnitude relationship between the first voltage $V_{21}'$ and the second voltage $V_{22}'$ is contrary to the magnitude relationship in the normal state.

When the offset load units 61A, 62A, 61B, and 62B are provided in this manner, the magnitude relationship between the first voltage $V_{21}'$ and the second voltage $V_{22}'$ in the abnormal state is fixed. Therefore, it becomes possible to surely detect the abnormal state just by the comparator unit 43 simply comparing the magnitude between the first voltage $V_{21}'$ and the second voltage $V_{22}'$.

Though Examples shown in FIGS. 7 and 8 exemplarily show the case where the offset load units 61A, 62A, 61B, and 62B are provided on both the first load units 41A and 41B side and the second load units 42A and 42B side, they may be provided on either the first load units 41A and 41B side or the second load units 42A and 42B side.

[2] In the illumination apparatus 1, while the LED element strings 211 to 21m and 221 to 22n are connected in parallel, the LED element strings 211 to 21m and 221 to 22n may be arranged according to any method without being restricted to the manner shown in FIG. 1. For example, FIG. 1 exemplarily shows the case where the LEDs 20 are arranged to form a plane, in which the LED element strings 211 to 21m and 221 to 22n each formed by the LEDs 20 aligned linearly in a first direction (the top-bottom direction in the drawing) are juxtaposed with one another in a second direction (the right-left direction in the drawing) being perpendicular to the first direction. However, the LEDs 20 may be arranged according to other aligning method.

Figure 9:
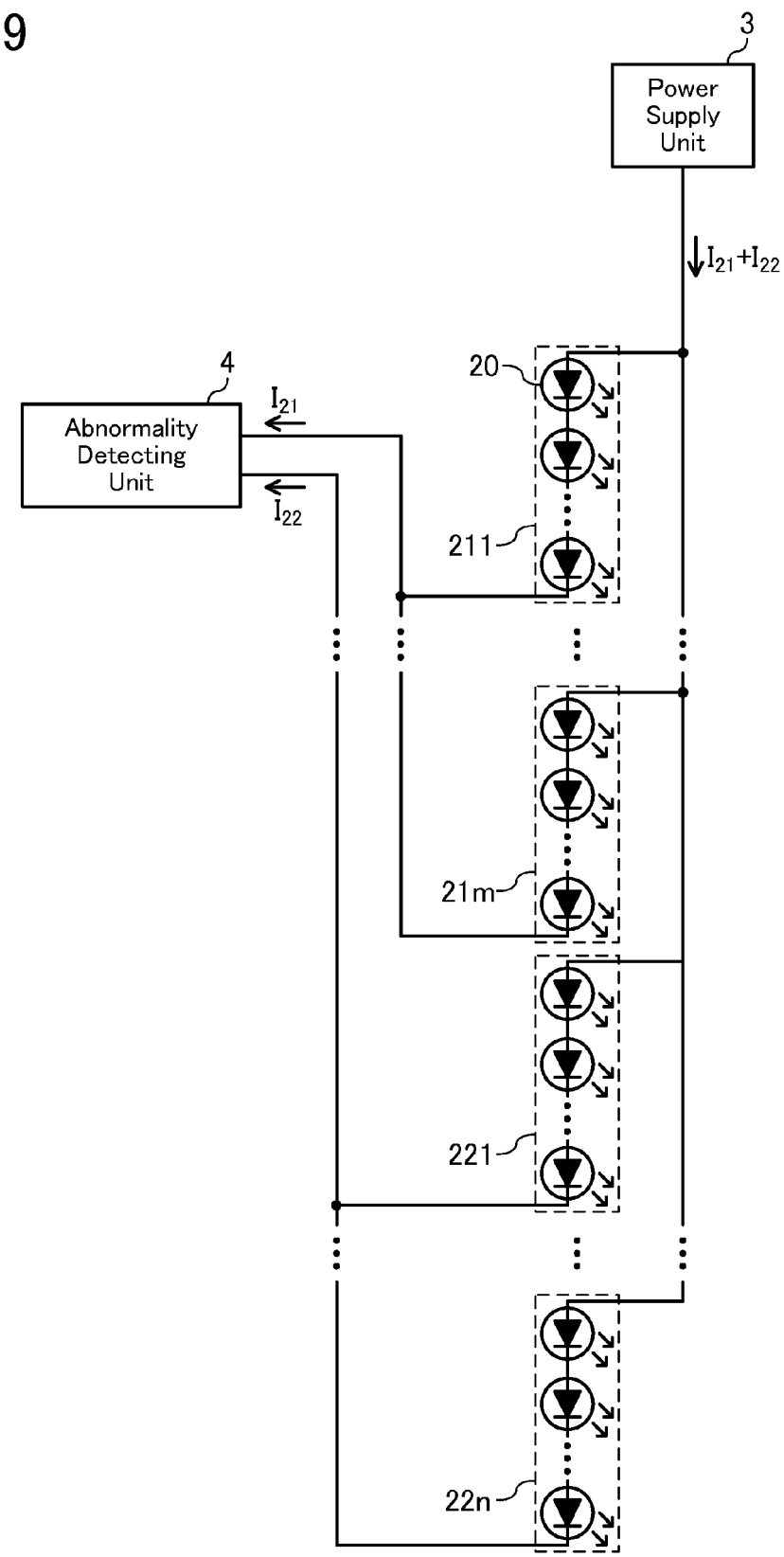
FIG. 9 is a block diagram showing other example of an LED aligning method.
Figure 10:
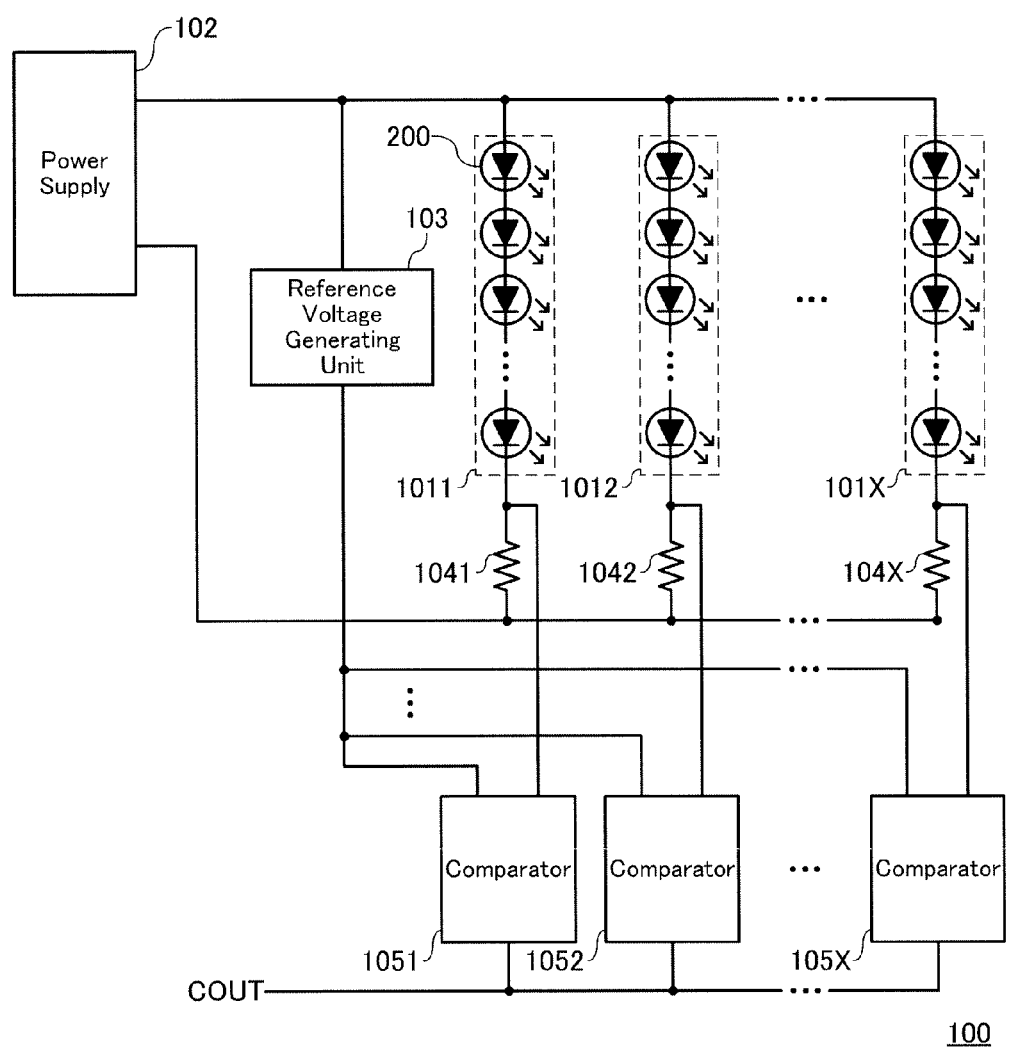
FIG. 10 is a block diagram showing a conventional illumination apparatus.

A description will be given of an exemplary method for aligning the LEDs 20 in a manner different from FIG. 1, with reference to the drawings. FIG. 9 is a block diagram showing other exemplary LED aligning method.

FIG. 9 shows an example in which the LED element strings 211 to 21m and 221 to 22n each formed by LEDs 20 aligned linearly in the first direction (the top-bottom direction in the drawing) are further aligned in the first direction, whereby the LEDs 20 are linearly arranged.

The LED element strings 211 to 21m and 221 to 22n are still connected in parallel to one another even when the LEDs 20 are arranged in the manner shown in FIG. 9. Therefore, as described above, an abnormality in the LED element strings 211 to 21m and 221 to 22n can be detected by the abnormality detecting unit 4.

Note that, the LEDs 20 may be arranged to form a plane by juxtaposing the LED element strings 211 to 21m and 221 to 22n arranged as shown in FIG. 9 in the second direction (the right-left direction in the drawing) being perpendicular to the first direction.

[3] Though FIGS. 3 and 4 respectively show, as specific examples of the first load unit 41 and the second load unit 42 shown in FIG. 2, the circuits in which the "number" of the resistors R1 and R2 and the transistors T1 and T2 having similar characteristics is adjusted, the first load unit 41 and the second load unit 42 are not limited to such circuits in which the "number" of the elements is adjusted. As described above, the first load unit 41 and the second load unit 42 can be in any manner so long as the ratio between the resistance value of the first load unit 41 and the resistance value of the second load unit 42 becomes n:m.

Specifically, for example, in the first load unit 41 and the second load unit 42, the "characteristic" (e.g., the size of the element) of the constituent element itself, e.g., the resistor or the transistor, may be adjusted. However, when the first load unit 41 and the second load unit 42 are the circuit in which the "number" of elements of a similar characteristic is adjusted as shown in FIGS. 3 and 4, the resistance value of the first load unit 41 and the second load unit 42 can be easily and precisely adjusted, and hence is preferable.

[4] The illumination apparatus 1 being capable of detecting an abnormality in the LED element strings 211 to 21m and 221 to 22n connected in parallel has been described by way of illustration as one embodiment of the present invention. However, the present invention is applicable also to an electronic device including elements (e.g., resistors) in place of the LEDs, so long as the electronic device has the elements or element strings connected in parallel.

CONCLUSION

The electronic device (illumination apparatus 1) according to the embodiment of the present invention can be grasped, for example, as follows.

An electronic device 1 including: a first element string group 21 formed by at least one element string 211 to 21m connected in parallel, the element string 211 to 21m being formed by at least one element 20 connected in series; a second element string group 22 formed by the element string 221 to 22n being at least one in number and connected in parallel; and an abnormality detecting unit 4 that detects an abnormality in the element string 211 to 21m and 221 to 22n forming at least one of the first element string group 21 and the second element string group 22, based on whether or not a first current $I_{21}$ being the sum of current flowing through the element string 211 to 21m forming the first element string group 21 and a second current $I_{22}$ being the sum of current flowing through the element string 221 to 22n forming the second element string group 22 satisfy a prescribed relationship.

With the electronic device 1, an abnormality in the LED element string 211 to 21m and 221 to 22n can be detected just by including the abnormality detecting unit 4 that detects that the relationship between the first current $I_{21}$ and the second current $I_{22}$ is abnormal.

Further, in the electronic device 1, the abnormality detecting unit 4 includes: a first load unit 41 having one end connected to the first element string group 21 to output a first voltage $V_{21}$ corresponding to the first current $I_{21}$ from the one end; a second load unit 42 having one end connected to the second element string group 22 to output a second voltage $V_{22}$ corresponding to the second current $I_{22}$ from the one end; and a comparator unit 43 comparing magnitude between the first voltage $V_{21}$ and the second voltage $V_{22}$ to detect an abnormality in the element string 211 to 21m and 221 to 22n belonging to at least one of the first element string group 21 and the second element string group 22. The first load unit 41 has other end connected to other end of the second load unit 42. The ratio between the resistance value of the first load unit 41 and the resistance value of the second load unit 42 is set to the ratio between a paralleled number n of the element string 221 to 22n forming the second element string group 22 and a paralleled number m of the element string 211 to 21m and 221 to 22n forming the first element string group 21.

With the electronic device 1, the abnormal state can be detected just by the abnormality detecting unit 4 comparing the magnitude between the first voltage $V_{21}$ and the second voltage $V_{22}$ (particularly, detecting that the first voltage $V_{21}$ and the second voltage $V_{22}$ are different from each other). Accordingly, the configuration of the abnormality detecting unit 4 can be simplified.

Further, in the electronic device 1, the first load unit 41A and the second load unit 42A are each formed by at least one resistor R1 and R2 connected in parallel. The ratio between a paralleled number of the resistor R1 forming the first load unit 41A and a paralleled number of the resistor R2 forming the second load unit 42A is set to the ratio between a paralleled number m of the element string 211 to 21m forming the first element string group 21 and a paralleled number n of the element string 221 to 22n forming the second element string group 22.

With the electronic device 1, the first load unit 41A and the second load unit 42A can be implemented by an extremely simple circuit, namely a parallel connection circuit of the resistors R1 and R2.

Further, in the electronic device 1, the first load unit 41B and the second load unit 42B are each formed by at least one transistor T1 and T2 connected in parallel, a first electrode of the transistor T1 and T2 being the one end and a second electrode of the transistor T1 and T2 being the other end. The transistor T1 forming the first load unit 41B and the transistor T2 forming the second load unit 42B have their respective control electrodes connected to each other. The at least one transistor T1 forming the first load unit 41B has the control electrode and the first electrode connected to each other. The ratio between a paralleled number of the transistor T1 forming the first load unit 41B and a paralleled number of the transistor T2 forming the second load unit 42B is set to the ratio between a paralleled number m of the element string 211 to 21m forming the first element string group 21 and a paralleled number n of the element string 221 to 22n forming the second element string group 22.

With the electronic device 1, the first load unit 41B and the second load unit 42B form a current mirror circuit in which current flowing through the transistor T1 having its control electrode and its first electrode connected to each other is the reference. Accordingly, in the normal state, the ratio between the first current $I_{21}$ and the second current $I_{22}$ can be precisely approximated to m:n. Further, it becomes possible to cause current of an identical value to stably flow through the LED element strings 211 to 21m and 221 to 22n that form the first LED element string group 21 and the second LED element string group 22, respectively. Still further, it becomes possible to precisely equalize the first voltage $V_{21}$ and the second voltage $V_{22}$.

On the other hand, in the abnormal state, though the first load unit 41B and the second load unit 42B operate as a current mirror circuit, it is not enough to recover the ratio of m:n between the first current $I_{21}$ and the second current $I_{22}$. Therefore, the ratio between the first current $I_{21}$ and the second current $I_{22}$ deviates from m:n, and the first voltage $V_{21}$ and the second voltage $V_{22}$ are different from each other. Accordingly, the comparator unit 43 can detect the abnormal state.

Note that, in the electronic device 1, the transistor is an NPN bipolar transistor whose collector is the first electrode, whose emitter is the second electrode, and whose base is the control electrode.

Further, the electronic device 1 further includes an offset load unit 61A, 62A, 61B, and 62B connected in parallel with at least one of the first load unit 41A, 41B and the second load unit 42A, 42B.

With the electronic device 1, by appropriately adjusting the resistance value of the offset load units 61A, 62A, 61B, and 62B, one of the first voltage $V_{21}$' and the second voltage $V_{22}$' in the normal state can be set to be slightly higher than the other. In this case, the comparator unit 43 can detect transition from the normal state to the abnormal state by detecting inversion of the magnitude relationship between the first voltage $V_{21}$' and the second voltage $V_{22}$' through use of an apparatus performing simple magnitude comparison, such as a comparator.

Further, in the electronic device 1, the element string 211 to 21m and the element string 221 to 22n forming the first element string group 21 and the second element string group 22, respectively, are equal to each other in characteristics as to current and voltage. The abnormality detecting unit 4 detects the abnormality in the element string 211 to 21m and 221 to 22n forming at least one of the first element string group 21 and the second element string group 22, when the ratio between the first current $I_{21}$ and the second current $I_{22}$ deviates from the ratio between the paralleled number m of the element string 211 to 21m forming the first element string group 21 and the paralleled number n of the element string 221 to 22n forming the second element string group 22 by more than a prescribed degree.

With the electronic device 1, the state where current does not flow evenly through all the element strings 211 to 21m and 221 to 22n, that is, the state where the ratio between the first current $I_{21}$ and the second current $I_{22}$ deviates from m:n by more than a prescribed degree (e.g., the magnitude corresponding to the hysteresis described above) can be detected as the abnormal state.

INDUSTRIAL APPLICABILITY

The present invention is applicable to an electronic device including a plurality of elements, for example LEDs.

DESCRIPTION OF SYMBOLS 1 illumination apparatus
20 LED (element)
21 first LED element string group (first element string group)
211 to 21m LED element string (element string)
22 second LED element string group (second element string group)
221 to 22n LED element string (element string)
3 power supply unit
4 abnormality detecting unit
41, 41A, 41B first load unit
42, 42A, 42B second load unit
43, 43a, 43b comparator unit
5 drive control unit
61A, 61B, 62A, 62B offset load unit
$I_{21}$ first current
$I_{22}$ second current
$V_{21}$ first voltage
$V_{22}$ second voltage R1, R2, R11, R12, R21, R22 resistor
T1, T2 transistor
C1, C2 comparator
G OR circuit
S output signal
D control signal

The invention claimed is:

1. An electronic device comprising:
a first element string group formed by one or more first element strings connected in parallel, each of the first element strings being formed by at least one element connected in series;
a second element string group formed by two or more second element strings connected in parallel, each of the second element strings being formed by the element being at least one in number and connected in series; and
an abnormality detecting unit that detects an abnormality in at least one of the first element strings or the second element strings, based on whether or not a first current being a sum of current flowing through the first element strings and a second current flowing through the second element strings satisfy a prescribed relationship,
wherein a number of the one or more first element strings in the first element string group is different from a number of the two or more second element strings in the second element string group.

2. The electronic device according to claim 1, wherein the abnormality detecting unit includes:
a first load unit having one end connected to each of the first element strings to output a first voltage corresponding to the first current from the one end;
a second load unit having one end connected to each of the second element strings to output a second voltage corresponding to the second current from the one end; and
a comparator unit comparing magnitude between the first voltage and the second voltage to detect an abnormality in at least one of the first element strings or the second element strings, wherein
the first element strings and the second element strings are approximately equal to each other in characteristics as to current and voltage,
the first load unit has other end connected to other end of the second load unit, and
(a resistance value of the first load unit):(a resistance value of the second load unit)=(a number of the second element strings):(a number of the first element strings).

3. An electronic device comprising:
a first element string group formed by one or more first element strings connected in parallel, each of the first element strings being formed by at least one element connected in series;
a second element string group formed by two or more second element strings connected in parallel, each of the second element strings being formed by the element being at least one in number and connected in series; and
an abnormality detecting unit that detects an abnormality in at least one of the first element strings or the second element strings, based on whether or not a first current being a sum of current flowing through the first element strings and a second current flowing through the second element strings satisfy a prescribed relationship, wherein
the abnormality detecting unit includes:
a first load unit having one end connected to each of the first element strings to output a first voltage corresponding to the first current from the one end;
a second load unit having one end connected to each of the second element strings to output a second voltage corresponding to the second current from the one end; and
a comparator unit comparing magnitude between the first voltage and the second voltage to detect an abnormality in at least one of the first element strings or the second element strings, wherein
the first element strings and the second element strings are approximately equal to each other in characteristics as to current and voltage,
the first load unit has other end connected to other end of the second load unit, and
(a resistance value of the first load unit):(a resistance value of the second load unit)=(a number of the second element strings):(a number of the first element strings), and wherein
the first load unit is formed by one or more first resistors connected in parallel, one end of each of the first resistors being connected to each of the first element strings,
the second load unit is formed by one or more second resistors connected in parallel, one end of each of the second resistors being connected to each of the second element strings,
other end of each of the first resistors is connected to other end of each of the second resistors, and
(a number of the first resistors):(a number of the second resistors)=(the number of the first element strings):(the number of the second element strings).

4. An electronic device comprising:
a first element string group formed by one or more first element strings connected in parallel, each of the first element strings being formed by at least one element connected in series;
a second element string group formed by two or more second element strings connected in parallel, each of the second element strings being formed by the element being at least one in number and connected in series; and
an abnormality detecting unit that detects an abnormality in at least one of the first element strings or the second element strings, based on whether or not a first current being a sum of current flowing through the first element strings and a second current flowing through the second element strings satisfy a prescribed relationship, wherein
the abnormality detecting unit includes:
a first load unit having one end connected to each of the first element strings to output a first voltage corresponding to the first current from the one end:
a second load unit having one end connected to each of the second element strings to output a second voltage corresponding to the second current from the one end; and
a comparator unit comparing magnitude between the first voltage and the second voltage to detect an abnormality in at least one of the first element strings or the second element strings, wherein
the first element strings and the second element strings are approximately equal to each other in characteristics as to current and voltage,
the first load unit has other end connected to other end of the second load unit, and (a resistance value of the first load unit):(a resistance value of the second load unit)=number of the second element strings):(a number of the first element strings), and wherein the first load unit is formed by one or more first transistors connected in parallel, a first electrode of each of the first transistors being connected to each of the first element strings, the second load unit is formed by one or more second transistors connected in parallel, a first electrode of each of the second transistors being connected to each of the second element strings, a control electrode of each of the first transistors is connected to a control electrode of each of the second transistors, and the control electrode and the first electrode of each of the first transistors are connected to each other, a second electrode of each of the first transistors is connected to a second electrode of each of the second transistors, and (a number of the first transistors):(a number of the second transistors)=(the number of the first element strings):(the number of the second element strings).

5. The electronic device according to claim 4, wherein each of the first transistors and the second transistors is an NPN bipolar transistor whose collector is the first electrode, whose emitter is the second electrode, and whose base is the control electrode.

6. The electronic device according to claim 2, further comprising:
an offset load unit connected in parallel with at least one of the first load unit and the second load unit.

7. The electronic device according to claim 1, wherein the first element strings and the second element strings are approximately equal to each other in characteristics as to current and voltage, and
the abnormality detecting unit detects the abnormality in at least one of the first element strings or the second element strings, when a ratio between the first current and the second current deviates from a ratio between the number of the first element strings and the number of the second element strings by more than a prescribed degree.

* * * * *